United States Patent
Ferré et al.

(10) Patent No.: US 8,159,228 B2
(45) Date of Patent: Apr. 17, 2012

(54) METHOD FOR DETERMINING BATTERY INTERNAL RESISTANCE

(75) Inventors: Antoni Ferré, Valls (ES); David Gámez, Valls (ES); Stanislaw Lincer, Valls (ES)

(73) Assignee: Lear Corporation, Southfield, MI (US)

( * ) Notice: Subject to any disclaimer, the term of this patent is extended or adjusted under 35 U.S.C. 154(b) by 631 days.

(21) Appl. No.: 12/337,900

(22) Filed: Dec. 18, 2008

(65) Prior Publication Data

US 2010/0156425 A1  Jun. 24, 2010

(51) Int. Cl.
*G01N 27/416* (2006.01)
(52) U.S. Cl. ........................................ 324/430
(58) Field of Classification Search .................. 324/430
See application file for complete search history.

(56) References Cited

U.S. PATENT DOCUMENTS

| | | | |
|---|---|---|---|
| 5,598,087 A | 1/1997 | Hara | |
| 6,163,133 A | 12/2000 | Laig-Horstebrock et al. | |
| 6,285,163 B1 | 9/2001 | Watanabe et al. | |
| 6,479,186 B1 | 11/2002 | Nemoto et al. | |
| 7,388,383 B2 | 6/2008 | Kawakami et al. | |
| 2004/0090719 A1* | 5/2004 | Larsson et al. | 361/2 |
| 2004/0095249 A1* | 5/2004 | Zaccaria | 340/636.1 |
| 2007/0035307 A1* | 2/2007 | Schoch | 324/426 |
| 2007/0216407 A1 | 9/2007 | Yamaguchi | |

FOREIGN PATENT DOCUMENTS

EP  1834187  9/2007

OTHER PUBLICATIONS

Meissner et al., "Battery Monitoring and Electrical Energy Management Precondition for Future Vehicle Electric Power Systems," Journal of Power Sources, pp. 79-98, 2003, Elsevier Science B.V.
van Bree et al., "Prediction of Battery Behavior Subject to High Rate Partial State-of-Charge," IEEE Xplore, 8 pages, 2007.

\* cited by examiner

*Primary Examiner* — Arun Williams
(74) *Attorney, Agent, or Firm* — Brooks Kushman P.C.

(57) ABSTRACT

A method of determining an internal resistance of a energy source that can be modeled as a voltage generator with a series resistance, such as but not limited to a battery or ultracapacitor. The internal resistance may be determined by averaging one or more weighting internal resistance values calculated from a number of sampled current and/or voltage measurement taken from the energy source.

20 Claims, 3 Drawing Sheets

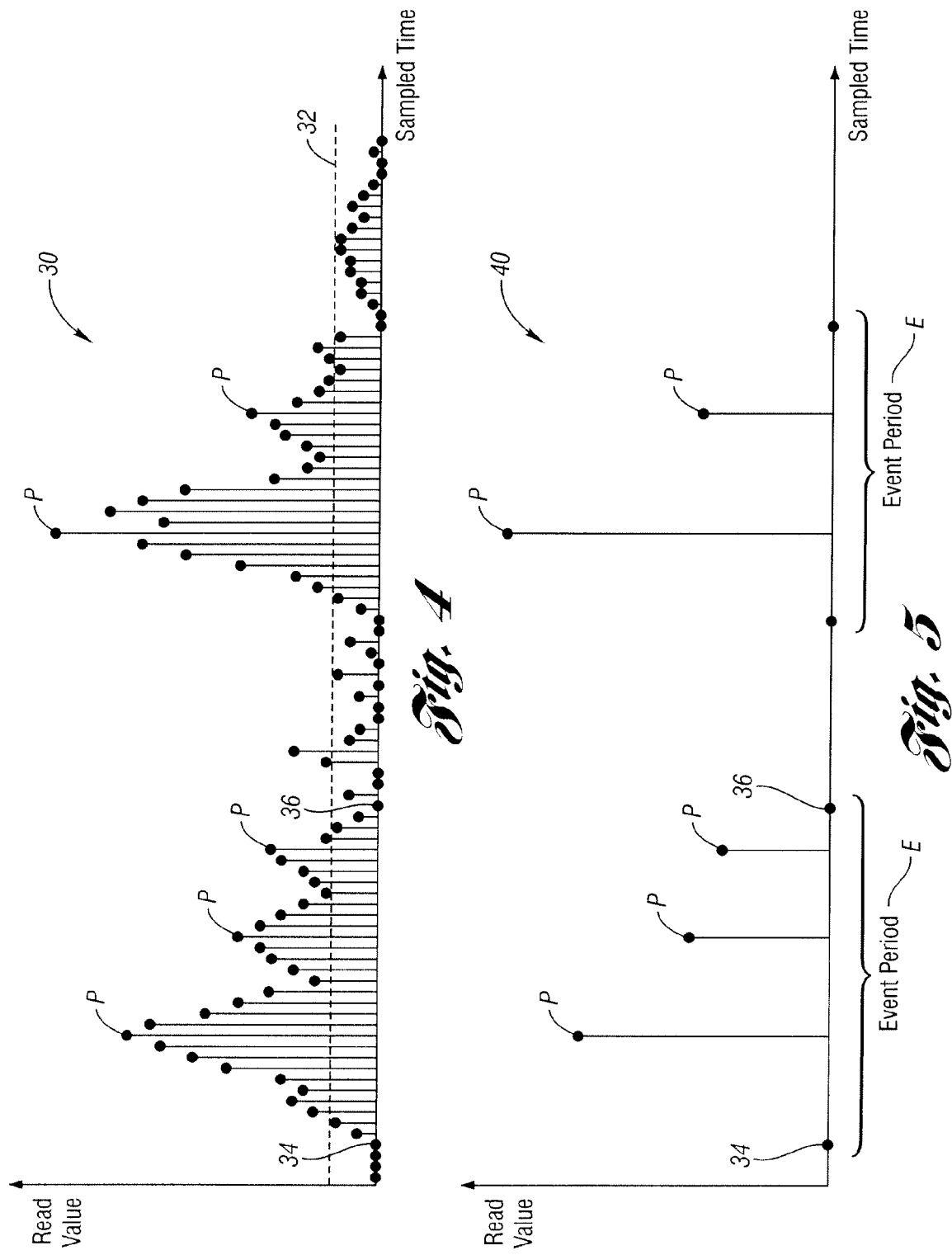

METHOD FOR DETERMINING BATTERY INTERNAL RESISTANCE

BACKGROUND OF THE INVENTION

1. Field of the Invention

The present invention relates to determining an internal resistance for an energy source, such as but not limited to a lead-acid battery used in a vehicle to provide direct current (DC) potential.

2. Background Art

Battery internal resistance is a basic value that can be used together with measured battery voltage, current and temperature by various vehicle systems and algorithms to evaluate the status of the battery and provide battery variables like real capacity, status of health, remaining minutes to total discharge, etc. Internal resistance, thus, enables battery status evaluation with even some forecast, which can be helpful in insuring sufficient supplies of electrical energy (battery capability to supply such) for vehicle critical functions like electric braking, start-stop functions and the like.

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

FIG. 4 illustrates an exemplary chart of sampled current in accordance with one non-limiting aspect of the present invention; and FIG. 5 illustrates the sampled current peaks according to event periods in accordance with one non-limiting aspect of the present invention.

DETAILED DESCRIPTION OF THE PREFERRED EMBODIMENT(S)

Figure 1:
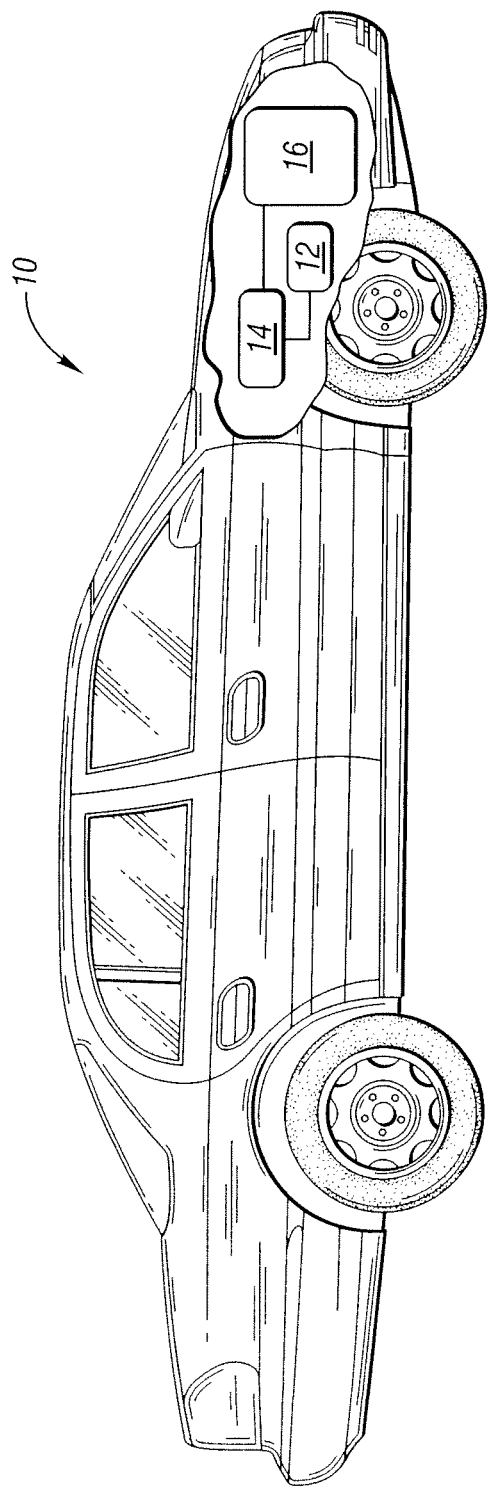
FIG. 1 illustrates a vehicle having a battery monitoring system (BMS) in accordance with one non-limiting aspect of the present invention.

FIG. 1 illustrates a vehicle 10 having a battery monitoring system 12 (BMS) in accordance with one non-limiting aspect of the present invention. The vehicle 10 includes a battery 14 for supplying energy to one or more loads 16. The BMS 12 may be a controller or other processing element configured in accordance with the present invention to determine an internal resistance of the battery 14. The controller 12 may include a computer-readable medium operating in cooperation with a processor (not shown) to execute a method for determining the internal resistance of the battery 14.

For exemplary purposes, the description is predominately set forth with respect to a lead-acid motor vehicle battery 14 used to a provide direct current (DC) potential or DC voltage to the one or more loads. The present invention, however, is not intended to be so limited and fully contemplates its use and application with any AC or DC power supply type devices, such as but not limited to an ultracapacitor or other device having an energy system that can be modeled as a voltage generator with a series resistance.

Figure 2:
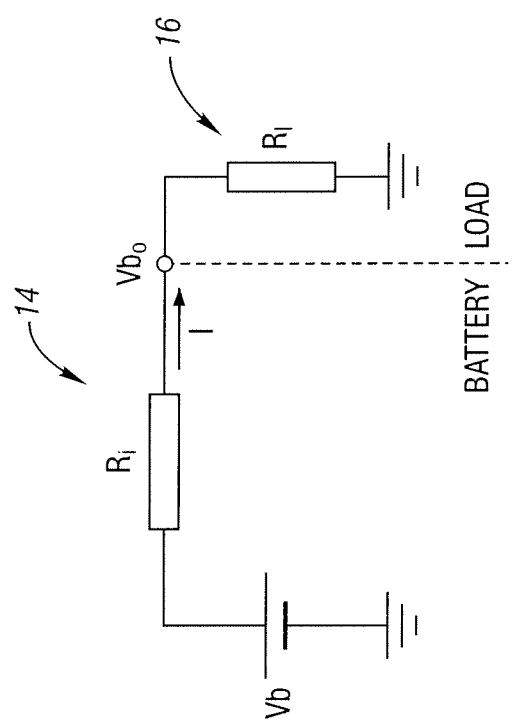
FIG. 2 schematically illustrates the battery as a voltage generator.

FIG. 2 schematically illustrates the battery 14 as a voltage generator (or internal battery voltage) $Vb_i$ having an internal resistance $R_i$ in series, giving an output voltage Vbo. If a current I is flowing to the load $R_l$, the internal resistance $R_i$ complies with the following formulae:

$$R_i = \frac{Vb_i - Vb_o}{I} = \frac{\Delta V}{I} = \frac{V_R}{I} \left. \right\} R_i = \frac{P_R}{I^2} = \frac{V_R \cdot I}{I \cdot I}$$
$$P_R = V_R \cdot I$$

Where $V_R$ and $P_R$ respectively equal the voltage and power drop across the internal resistance $R_i$.

Also, if we consider two instants in time:

Instant 1: $Vb_{o_1} = Vb_i - I_1 \cdot R_i$

Instant 2: $Vb_{o_2} = Vb_i - I_2 \cdot R_i$

The output battery voltage $Vb_o$ and current I can be measured with the BMS 12. The internal voltage $Vb_i$ is more difficult to measure, and is modeled instead of being measured, for the purposes of one non-limiting aspect of the present invention, as a constant such that the internal resistance Ri can be calculated according to the following formula:

$$Vb_{o_2} - Vb_{o_1} = I_1 \cdot R_i - I_2 \cdot R_i \Rightarrow \Delta Vb_o$$
$$= -\Delta I \cdot R_i \Rightarrow R_i$$
$$= -\frac{\Delta Vb_o}{\Delta I}$$
$$= \frac{\Delta Vb_o \cdot \Delta I}{\Delta I \cdot \Delta I}$$

The internal battery voltage does vary with time but can be taken as constant for the purposes of the present invention since sample rates and their processing are much faster than the voltage variations. The battery internal impedance model is more complex than the simple resistance model employed by the present invention, but, again, with the appropriate sample speed the changes between samples can be simplified to only the equivalent internal resistance of the battery. Thus, the battery internal resistance Ri is directly related with variations of output signals over two time instants. The same may apply when the battery is charged, that is, when a generator is connected instead of a load to cause current to flow inversely.

Figure 3:
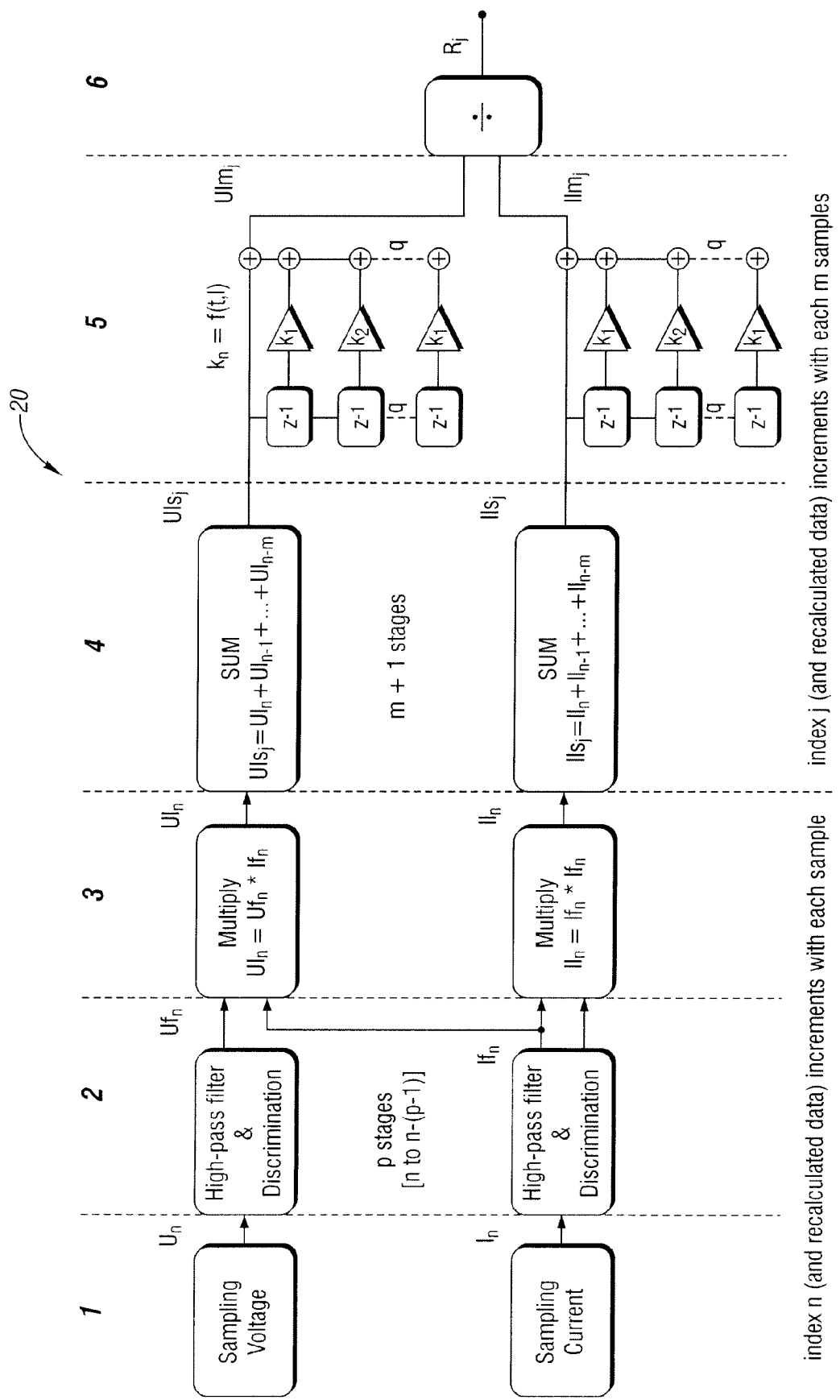
FIG. 3 illustrates a flowchart of a method of determining battery internal resistance in accordance with one non-limiting aspect of the present invention.

FIG. 3 illustrates a flowchart 20 of a method of determining battery internal resistance $R_i$ in accordance with one non-limiting aspect of the present invention. The method may be executed according to instructions embedded within the computer-readable medium of the BMS 12 or otherwise programmed into the controller in a manner sufficient to facilitate executing the operations contemplated by the present invention to calculate internal battery resistance Ri.

In phase 1, the voltage across the battery U(t), representing $Vb_o$ shown in FIG. 2, and the current to or from the battery I(t), representing I shown in FIG. 2, are sampled at a repetitive rate to create a series of digitalized voltage and current sample values U(n) and I(n). The sampled values U(n) and I(n) may be stored or temporarily buffered by the controller 12. Each stored value may be defined as a 'sample' in that it represents the battery voltage U(n) or current I(n) at a particular instance of time. Optionally, vehicle operation conditions occurring proximate in time to recordation of the sample may be saved to facilitate assessing conditions attendant the samples. FIG. 4 illustrates an exemplary chart 30 of 'n' number of sampled current values I(t) sensed over a period of time T.

In phase 2, while hardware may be used, the voltage U(n) and current I(n) may be high-pass filtered. The sampled U(n) and I(n) values may be digitally processed to assess voltage variations sufficient to be considered as peak current changes caused by a switching event, such as during engine cranking, air conditioning activation, heater operations and other higher current drawing loads. This selective discrimination step may be done in order to filter-out noise and other less significant variations, such as those resulting from activating an interior light or other lower current draw type devices are also lost.

Peak detections may require certain number of successive current increases above a threshold level of current before a peak may be determined. As illustrated, four successive current increases above a threshold current level 32 is required to determine the peaks P. FIG. 5 illustrates the sampled current values according to switching event periods 'E' where different switching events, such as where vehicle cranking is followed by activation of an air conditioning system. Over time, multiple switching event periods E may occur. The duration of each switching event E may be defined from a sample 34 preceding current increases leading to a peak P and a sample after the last of the decreasing current samples.

Optionally, the number of successive increases and/or threshold value 32 used to assess current peaks P may be adjusted according to the active load. For example, if a higher current drawing load is known to be active, a lesser number of successive increases may be required in comparison to a lower drawing load being active. The ability to adjust the filtering of current peak periods P depending on current draw and/or the identity of the load drawing the current can be helpful in limiting the likelihood of sensor or measurement tolerances reducing accuracy.

At the end of each peak period P, the BMS 12 may calculate a resulting voltage Uf(p) and current If(p) based on the variation in voltage and current occurring from the beginning to the ending of the peak P. The Uf(p) and If(p) values represent a voltage and current change during each peak period P of a switching event E. In some cases, a single switching even may include multiple Uf(p) and If(p) values if multiple peaks P are detected. The Uf(p) and If(p) values are described to be high-pass filtered and threshold-discriminated outputs of phase 2 and representative of battery output voltage and current changes during the period time that the corresponding number of samples were recorded.

In phase 3, the Uf(p) and If(p) values may be multiplied by the current If(P) to enter the power domain, providing UI(p)=Uf(p)×If(p) and square current II(p)=If(p)×If(p). The controller 12 may include software or hardware may be used to complete this operation. One non-limiting aspect of the present invention contemplates prioritizing the samples from high-energy peaks as these provide the best data to calculate $R_i$, that is, with less influence from other overlapped signals. The is process of transforming the sampled voltage and current values in the power domain is one way of doing this.

In phase 4, normal switching events found in a vehicle electric network may be a combination of more than one current peak (one major peak followed by some minor ones). In this manner, a switching event may include multiple Uf(p) and If(p) values (or multiple sets/groups of P number of sampled U(t) and I(t) values) to identify each of the peaks occurring during each switching event E. For this reason, all relative values in a switching event E are added together such that obtained UI(p) and II(p) values are summed over a programmable "(m+1)" range (the length of the event), obtaining an accumulated value:

$$UIs(j)=UI(n)+UI(n-1)+\ldots+UI(n-m)$$

$$IIs(j)=II(n)+II(n-1)+\ldots+II(n-m)$$

Optionally, at the end of phase 4, the internal resistance $R_i$ can be determined for any one of the switching events according to the following formula:

$$R_i=UIs(j)/IIs(j)$$

where j is one of the switching events E. The resulting value represents battery internal resistance for the j switching event E based on a summation of voltage and current changes occurring throughout the event E.

As one non-limiting aspect of the present invention relies on peaks occurring during the vehicle operation, at any given time, the switching event may be small or even nonexistent when an estimation of internal resistance is desired. Because some estimation of the current internal resistance $R_i$ may be required, in phase 5, this estimation may be calculated based on prior measurements.

These prior measurements can be helpful since battery internal resistance progressively changes over time. The internal resistance at a given time (sample "n"), may be very similar to "just a moment before" (sample "n−1"). However, the previous value may result from a small switching event, meaning the value may be less reliable than if the it resulted from a "large-power" switching event. Moreover, a previous value from "some time ago" (sample "n−j") although good may be less reliable than a 'more recent' value (considering $R_i$ has evolved). The present invention contemplates some proportioning between these characteristics to determine the internal resistance $R_i$.

One non-limiting aspect of the present invention contemplates summing a series "q" of previous resulting UIs(j) and IIs(j) (valid data) together with each value being weighted by a number, ($K_i$), which depends on the "strength" (power) and the "freshness" (distance in time) of such value. These values may then be accumulated over a programmable "q" range, (defined from empiric experience).

($K_i$) formula is as follows (being "i" one of said "q" samples numbered from more recent, "1", to older, "q"):

$$K_i=K_o \cdot I_i^2 \cdot (q-(i-1))$$

In this way, values of UIs(j) and IIs(j) computed from large values of $I^2$ are boosted, while values of UIs(J) and IIs(j) computed from low values of $I^2$ are diminished. Also, depending on time passed from the measure, recent values of UIs(j) and IIs(j) are boosted, while older values of UIs(j) and IIs(j) are diminished.

In phase 6 the final value of Ri is obtained by dividing the resulting weighted UIs(j) and IIs(j) values, referred to as UIm(j) by IIm(j), such that the internal resistance is given by the following formula.

$$R_i=UIm(j)/IIm(j)$$

Internal resistance may be obtained by different methods, normally related with the V/I quotient and using some proprietary processing algorithms. For instance, by forcing a specific and time-repetitive current pulses and monitoring the corresponding battery output voltage changes. Other methods are based on just monitoring voltage and current due to vehicle-loads switching. An example of this second option is the use of a proportion-integrate-derivative (PID) type controller for the processing that relies on closed-loop feedback (previous processed data fed back into input data). The method of the present invention is based in monitoring voltage and current in the vehicle, but considering previous measured values to obtain processed present output. Furthermore, the present invention weighs the effect of previous values according to the amount of energy included in it and the time distance to a present value.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of determining internal resistance of a vehicle battery used to power one or more vehicle loads, the method comprising:
   periodically sampling current and voltage outputted from the battery to determine sampled current and voltage values;
   filtering the sampled current and voltage values into switching events, each switching event including at least one sampled current value, defined as a peak current value, that is greater than a current threshold;
   determining an internal resistance value for each of the switching events by averaging a division of the voltage value by the current value sampled at the same time for each voltage value and current value corresponding with each of the peak current values;
   weighting a 'q' number of the internal resistance values;
   determining the internal resistance to be an average of the weighted internal resistance values; and
   arranging the sampled current and voltage values into the same switching event if the sampled current and voltage values occur between a beginning and ending defined for each switching event, the beginning corresponding with the first sampled current value above the current threshold and the ending corresponding with the first successive sampled current value below the current threshold.

2. The method of claim 1 further comprising multiplying each of the 'q' number of internal resistance values by a K value wherein the K value assigned to more recent internal resistance values are greater than the K value assigned to less recent internal resistance values.

3. The method of claim 1 further comprising multiplying each of the 'q' number of internal resistance values by a K value wherein the K value assigned to internal resistance values resulting from larger current peaks are greater than the K value assigned to internal resistance values resulting from smaller current peaks.

4. The method of claim 1 wherein the more recent internal resistance values are weighted more than less recent internal resistance values and the internal resistance values resulting from greater current peaks are weighted more than internal resistance values resulting from lesser current peaks.

5. The method of claim 1 further comprising multiplying each of the 'q' number of internal resistance values by a K value wherein the K value is determined by the following formula:

$$K_i = K_0 \cdot I_i^2 \cdot (q-(i-1))$$

where $K_o$ is a constant, I is the sampled current value, and "i" is one of the "q" number of the internal resistance values numbered from more recent, "1", to older, "q".

6. The method of claim 1 further comprising determining the peaks to correspond with a last sampled one of successes increases of at least two successive increases in sampled current above the current threshold.

7. The method of claim 1 further comprising dividing the sampled peak current values and voltage values after transforming the peak current values and voltage values into the power domain.

8. The method of claim 7 wherein the peak current values and voltage values are transformed into the power domain by multiplying the peak current value by the voltage value and then dividing by the square of the peak current value.

9. A method of determining internal resistance comprising:
   periodically sampling current and voltage outputted from an energy source;
   determining an internal resistance values by dividing a selected one or more of the sampled voltage values by the current value sampled at the same time;
   weighting a 'q' number of the internal resistance values by the following formula:

$$K_i = K_0 \cdot I_i^2 \cdot (q-(i-1))$$

where $K_o$ is a constant, I is the sampled current value, and "i" is one of the "q" number of the internal resistance values numbered from more recent, "1", to older, "q"; and
   averaging the weighted internal resistance values to determine the internal resistance.

10. The method of claim 9 further comprising transforming the selected peak current values and voltage values into the power domain before dividing the selected values to determine the internal resistance values.

11. The method of claim 10 wherein the peak current values and voltage values are transformed into the power domain by multiplying the peak current value by the voltage value and then dividing by the square of the peak current value.

12. A method of determining internal resistance of a vehicle battery used to power one or more vehicle loads, the method comprising:
   periodically sampling current and voltage outputted from the battery to determine sampled current and voltage values;
   transforming the sampled current and voltage into the power domain by multiplying the voltage value by the corresponding current value and squaring the current value;
   arranging the transformed current and voltage values into switching events, each switching event including at least one peak defined by a sampled current value being greater than a current threshold, each peak being a last sampled one of successive increases of at least two successive increases in sample current values greater than the current threshold;
   determining an internal resistance value for each of the switching events by averaging a division of each of the transformed current and voltage values corresponding with each peak within the switching event; and determining the internal resistance to be an average of the internal resistance values.

13. The method of claim 12 further comprising weighting the internal resistance values and determining the internal resistance to be the average of the weighted internal resistance values.

14. The method of claim 13 further comprising weighting the more recent internal resistance values more than less recent internal resistance values.

15. The method of claim 13 wherein internal resistance values resulting from larger peaks are weighted more than internal resistance values resulting from smaller peaks.

16. The method of claim 13 wherein the more recent internal resistance values are weighted more than less recent internal resistance values and the internal resistance values resulting from greater peaks are weighted more than internal resistance values resulting from lesser peaks.

17. The method of claim 13 wherein the internal resistance values are weighted by the following formula:

$$K_i = K_0 \cdot I_i^2 \cdot (q-(i-1))$$

where $K_o$ is a constant, I is the sampled current value, and "i" is one of the "q" number of the internal resistance values numbered from more recent, "1", to older, "q".

18. The method of claim 13 further comprising requiring at least two consecutive increases in sampled current values to occur before determining the sampled current and voltage values associated with the last of the at least two consecutive current increases to be the current and voltage values corresponding with the peak.

19. The method of claim 18 further comprising requiring the first of the at least two consecutive increases in current to be greater than a current threshold.

20. The method of claim 12 further comprising arranging the sampled current and voltage values into the same switching event if the sampled current and voltage values occur between a beginning and ending defined for each switching event, the beginning corresponding with the first sampled current value above the current threshold and the ending corresponding with the first successive sampled current value below the current threshold.

* * * * *